United States Patent [19]

Fukuwatari et al.

[11] Patent Number: 4,877,123
[45] Date of Patent: Oct. 31, 1989

[54] CONVEYOR MEANS FOR WAFERS

[76] Inventors: Ichiro Fukuwatari; Seiji Watanabe, both c/o Hitachi Kiden Kogyo, Ltd., 1-go 11-ban, 3-chome, Shimosakabe, Amagasaki, Hyogo, Japan

[21] Appl. No.: 166,308
[22] Filed: Mar. 10, 1988

[30] Foreign Application Priority Data

Nov. 2, 1987 [JP] Japan ................................ 62-278016

[51] Int. Cl.$^4$ ............................................. B65G 35/00
[52] U.S. Cl. ...................................... 198/619; 104/140; 104/173.1; 104/281; 104/283
[58] Field of Search ................. 198/619; 104/281, 282, 104/283, 286, 134, 154, 139, 140, 174, 173.1; 211/41, 162

[56] References Cited

U.S. PATENT DOCUMENTS

| | | | |
|---|---|---|---|
| 3,951,074 | 4/1976 | Cooper | 104/283 |
| 4,471,716 | 9/1984 | Milliren | 211/41 |
| 4,619,573 | 10/1986 | Rathmann et al. | 198/619 |
| 4,669,612 | 6/1987 | Mortensen | 211/41 |
| 4,739,710 | 4/1988 | Imamura et al. | 104/139 |

FOREIGN PATENT DOCUMENTS

| | | | |
|---|---|---|---|
| 57304 | 8/1912 | Austria | 104/174 |
| 0052149 | 3/1982 | Japan | 198/619 |
| 0018305 | 1/1986 | Japan | 104/283 |
| 1240647 | 10/1986 | Japan | 198/619 |

Primary Examiner—Andres Kashnikow
Assistant Examiner—Christopher G. Trainor
Attorney, Agent, or Firm—Wenderoth, Lind & Ponack

[57] ABSTRACT

A conveyor for use in a room with a high degree of cleanness and which can convey wafers one by one stably, without generation of dust. The conveyor has vehicles having a slit in the surface on which a wafer can be placed, permanent magnets provided on the undersurface of the vehicle, and a magnetic fluid interposed between the permanent magnets and a transporting course for floating the vehicle. By moving the vehicle along the transporting course by linear motors or by driving devices of the rope trolley type, wafers are conveyed one by one on the vehicle.

1 Claim, 3 Drawing Sheets

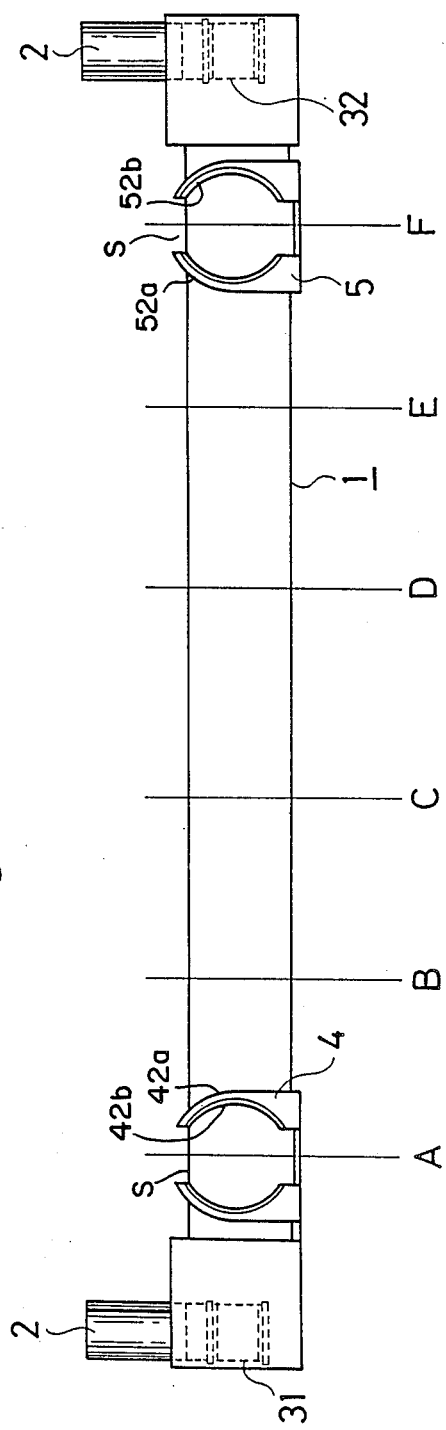
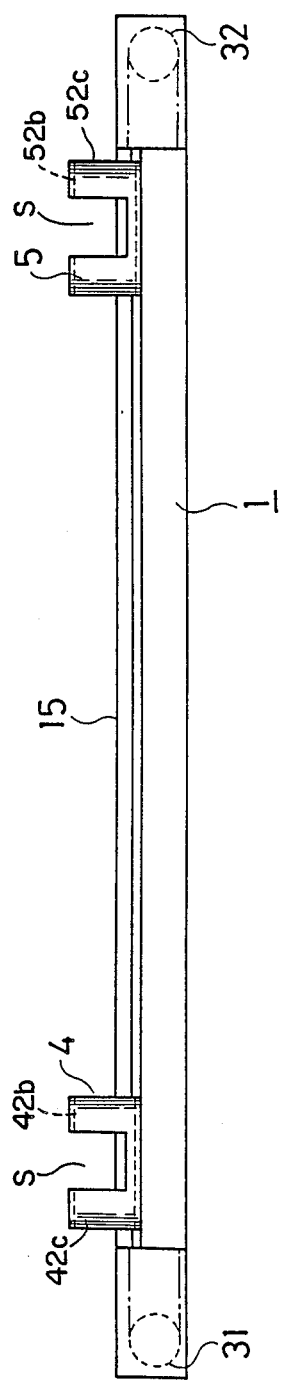

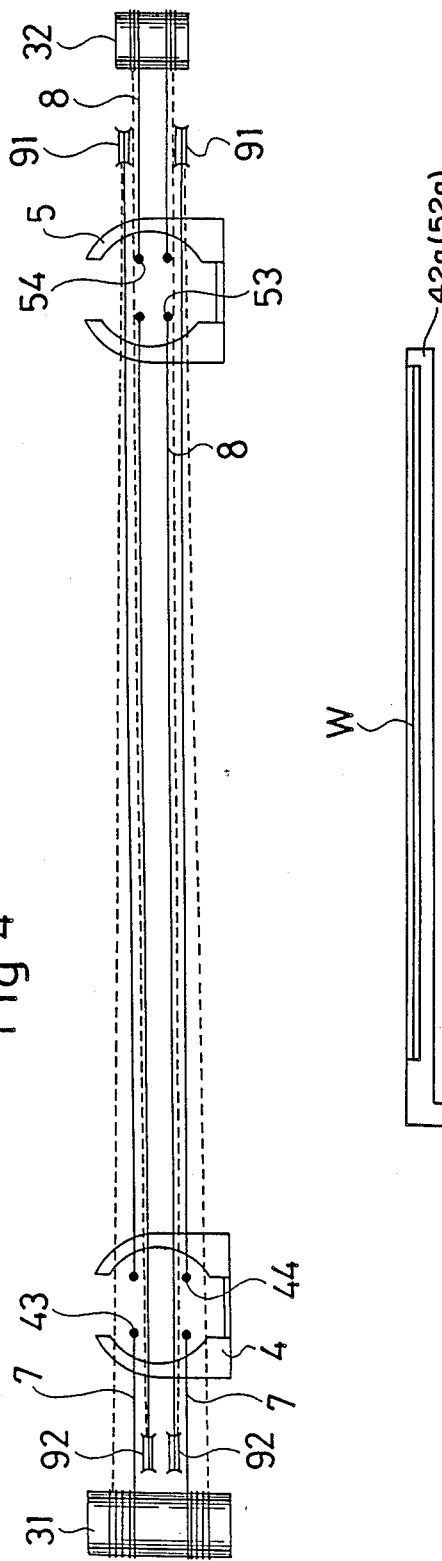
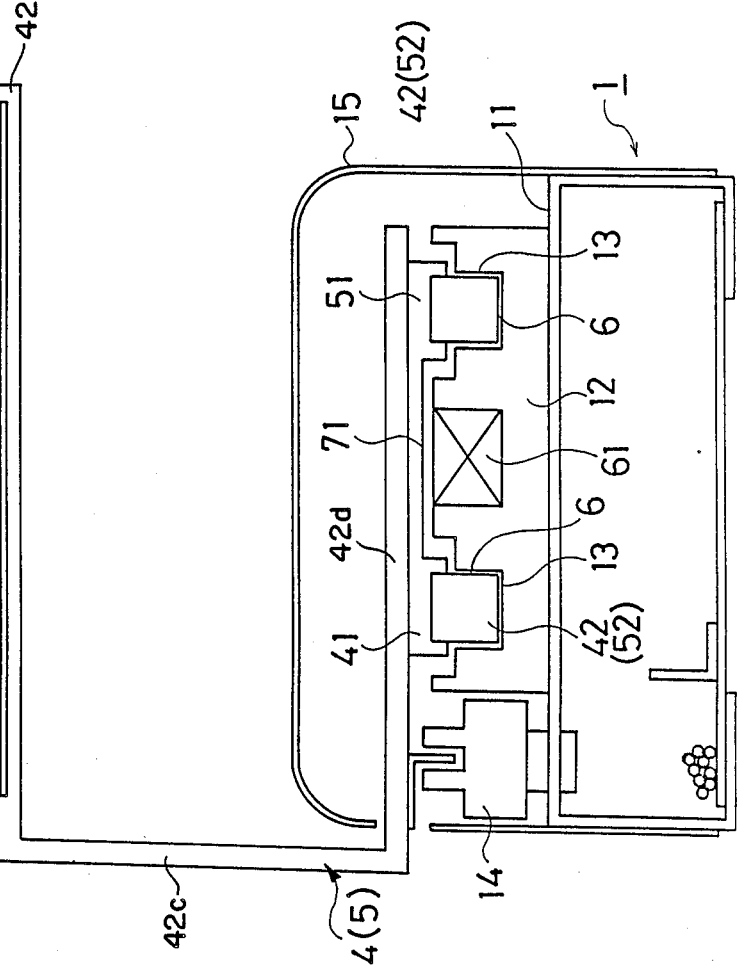

CONVEYOR MEANS FOR WAFERS

BACKGROUND OF THE INVENTION

1. Field of the Invention

This invention relates to a conveyor means for conveying wafers one by one.

2. Prior Art

As a means of conveying thin sheet-like goods such as semiconductor wafers in a clean room, there are available (1) the method of floating wafers by air pressure and then conveying them by injection air pressure, (2) the method of conveying wafers placed on a conveyor and the like.

However, in the case of the former method (1), it requires a device for supplying air pressure at all times and also involves a drawback that dust is liable to rise from a guide or a stopping device along the transporting path. Thus, this method is not suitable for use in a clean room.

In the case of the latter method (2), when wafers are being conveyed on a belt, dust from the belt sticks to the backs of the wafers and as a result, the yield of the wafer manufacturing process is reduced.

Conventionally, between processing machines wafers were usually transported in a wafer cassette which can hold several wafers, instead of transporting wafers one by one. However, with the increasing diameter of the wafers and with the growing tendency to multi-variety small-lot production of the wafers in recent years, means for conveying wafers one by one has come to be demanded. Moreover, processing of waferS has become more and more minute and this tendency necessitates a conveyor means with a higher degree of cleanness.

SUMMARY OF THE INVENTION

The present invention is a simple means of conveying wafers one by one both stably and free from generation of dust. This conveyor means can safely be used in a clean room with a high degree of cleanness. It comprises vehicles having a slit in the surface on which the wafer is placed, a permanent magnet provided at the undersurface of the vehicle, and a magnetic fluid interposed between the permanent magnet and the transporting path for floating a vehicle. By moving the vehicle along the transporting path by a linear motor or by a driving device of the rope trolley type, wafers are conveyed one by one along the path.

BRIEF DESCRIPTION OF THE DRAWINGS

The nature and advantages of the present invention wll be understood more clearly from the following description made with reference to the accompanying drawings, in which:

FIG. 1 is a plan view showing the whole of a conveyor means according to the present invention;

FIG. 2 is a front view of the conveyor means shown in FIG. 1;

FIG. 4 is an explanatory drawing showing how the rope is stretched;

FIG. 6 is a side view, in vertical section, of a second embodiment of a conveyor means according to the present invention.

DETAILED DESCRIPTION OF THE INVENTION

Figure 3:
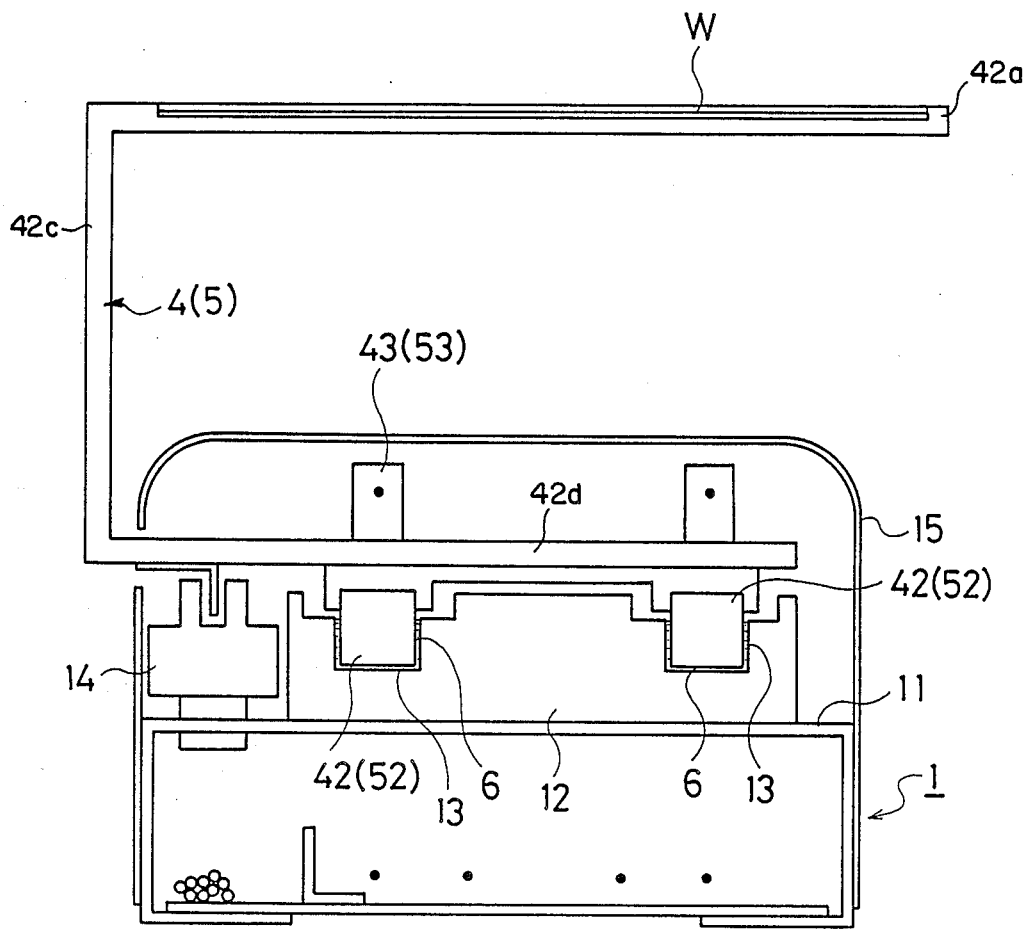
FIG. 3 is a side view, in vertical section, of the conveyor means shown in FIG. 1.

A description is given below of a conveyor means according to the present invention, with reference to embodiments shown in the drawings.

In the drawing, numeral 1 designates a transporting course made of a non-magnetic substance. As shown in FIG. 3, this transporting course 1 comprises a base table 11 and a travelling guide 12 provided on the base table 11. The travelling guide 12 has in the top surface thereof at least two grooves 13 extending along the whole length of the transporting course 1. Provided at the side of the guide 12 is at least one sensor 14 which detects the position of a vehicle so as to enable stopping the vehicle at a predetermined position at the transporting course.

Provided oppositely both end portions of the transporting course 1 are drums 31 and 32 which are driven in rotation by a power source 2. These drums 31 and 32 are turned forward and reversely by the power source 2 or through the medium of a transmission.

Figure 5:
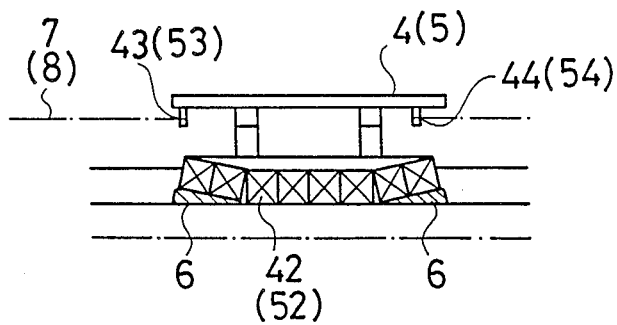
FIG. 5 is an explanatory drawing showing the relation between the vehicle and the travelling guide.

Two vehicles 4 and 5 are placed on the transporting course 1. These vehicles 4 and 5 are the same in shape and, as shown in FIG. 1, have a generally C-shaped cross-section when viewed in side elevation. Each vehicle has an upper arm 42a (52a) with a wafer receiver recess 42b (52b) therein, a vertical arm 42c (52c) from the upper end of which said upper arm 42a (52a) extends and a lower arm 42d (52d) extending from the lower end of vertical arm 42c (52c). The upper arm 42a (52a) and the vertical arm 42c (52c) have a transverse slot 5 therethrough so as to enable the fork of a transferring device (not shown in the drawing) to be inserted therein for engaging the wafer for transferring it. Provided on the lower surface of the lower arm of the vehicle are magnet holding tables 41 and 51. Permanent magnets 42 and 52 are fixed to the lower surface of the magnet holding tables 41 and 51. Numeral 6 designates a magnetic fluid which is interposed between the lower surface of the magnet fitting tables 41 and 51 and grooves 13 so that the magnetic field of the permanent magnets 42 and 52 can act thereon. The permanent magnets 42 and 52 can be a magnet bar with a length almost the same as the length of the vehicle. As shown in FIG. 5, a plurality of permanent magnets 42 and 52 at the front part and at the rear part, in relation to the running direction of vehicles 4 and 5 are in an upwardly inclined state so that when the vehicle advances or retreats, magnetic fluid in the groove is kept interposed between the permanent magnet and the bottom part of the groove of the transporting course, namely, the permanent magnet is prevented from contacting the groove.

The magnetic fluid 6 is disposed in the groove 13 of the travelling guide 12 so that magnetic field of the permanent magnets 42 and 52 can act thereon. This magnetic fluid can be a known colloidal solution which is produced by covering the surface of minute magnetic particles (ferrite, for example) with long chain unsaturated fatty acid and disposing them in a solution by using a surfactant.

Movement of the vehicles 4 and 5 is effected by winding ropes 7 and 8 stretched between drums 31 and 32 and vehicles 4 and 5 and which wind on and off the drums. The rope 7 is first wound round the drum 31 in one or several turns and then one end of it is fastened to a rope attaching member 43 provided on the vehicle 4 and the other end of it is passed around a sheave 91 which is at the opposite end of the course 1 from the drum 31 and is fastened to a rope attachment member 44 of the vehicle 4. Thus, the rope 7 is stretched between the drum 31 and the sheave 91 and its opposite ends are fixed to the vehicle. By rotating the drum 31, the vehicle 4 is reciprocated along the travelling guide 12 by the rope 7.

Similarly, the rope 8 is first wound round the drum 32 in one or several turns and then one end of it is fastened to a rope attachment member 53 of the vehicle 5 and the other end of it is passed around a sheave 92 which is at the opposite end of the course 1 from the drum 32 and is fastened to a rope attachment member 54 of the vehicle 5. Thus, two vehicles 4 and 5 are disposed, spaced from each other, along the grooves 13 of the travelling guide 12 in such a fashion that the vehicles can travel freely while supported on the magnetic fluid. Ropes 7 are moved selectively by the rotation of drums 31 and 32. The vehicle 4 can travel between point A and point E, and the vehicle 5 can travel between point F and point B (FIG. 1). The two vehicles are so controlled that they do not come into contact with each other. The travelling distance and the stop position of each vehicle depends upon the process being carried out on the wafer W being carried. The distance between the points and the number of stop positions are determined arbitrarily. The stopping of a vehicle at a fixed position is effected by detecting the position of the vehicle by the sensor 14 arranged at the side of the travelling guide.

In order to prevent dust which is generated during travelling of a vehicle from dispersing in the clean room, the transporting course is covered in part or wholly with a cover 15 having a slit in one side through which the vehicles extend.

The vehicle is caused to float above the travelling guide 12 by the action of the permanent magnet and the magnetic fluid and is caused to travel by the force on the corresponding rope. The magnetic fluid 6 is an aggregate which is moved magnetically by the permanent magnet and has a paramagnetic property. Under the influence of magnetic field which is generated from the permenent magnets 42 and 52 provided on the lower surface of the vehicles 4 and 5, the magnetic fluid 6 is attracted to the circumference of the permannent magnets 42 and 52 and as a result, a buoyant force is generated magnetically and the permanent magnets 42 and 52 are caused to float in the magnetic fluid. Thus, the vehicle under which permanent magnets 42 and 52 are provided is caused to float.

As the vehicle moves by the driving force of the ropes 7 and 8 and the magnetic fluid 6 moves with the permanent magnets 42 and 52, and the vehicle is caused to float and move. Because in this embodiment the vehicles are supported at two points, i.e. by two magnets 42 and two magnets 52, and are driven by the ropes, the vehicle can be moved in a stabilized state at all times. Since the cover 15 is provided for the transporting course 1, the magnetic fluid is prevented from flowing out of the transporting course 1 and also evaporation loss of solvent of the magnetic fluid can be reduced.

FIG. 6 is a side view, in vertical section, of the second embodiment of the conveyor means for wafers according to the present invention. In this embodiment, vehicles are moved along the transporting course by linear motors.

Stators 61 of the linear motor are provided on the upper surface of the travelling guide 12 at fixed intervals in the running direction of the vehicles 4 and 5. A bottom surface 71 of the vehicles 4 and 5 which opposes the stator 61 of the linear motor is composed of a conductive substance, such as aluminum, copper plate or the like, so that it can act as the reaction plate of the linear motor. The bottom surface 71 is opposed to the stator 61 across a gap so that a linear motor is formed.

In the above construction, vehicles are caused to float above the travelling guide by the action of the permanent magnets and the magnetic fluid and are caused to travel by linear motors.

In each of the above embodiments, two grooves 13 are provided in the travelling guide but the number of grooves is not limited to two but can be one or more than three.

The number of vehicles to be placed on the transporting course is two in these embodiments but it can be changed as desired, namely to one or more than two.

According to the present invention, the surface of the vehicle is so shaped that one wafer can be placed thereon in a stabilized state and vehicles are caused to float by the action of both magnetic fluid and the permanent magnets and are caused to travel along the transporting course by the ropes or by linear motors. Therefore, generation of dust can be reduced by this simple construction and the material of the vehicles can be selected arbitrarily. Moreover, since there is no source generating vibration of wheels, gears, etc., no vibration is imparted to the wafers.

The present invention has such merits that wafers can be conveyed smoothly one by one, its construction is very compact and transportation of high cleanness can be carried out.

We claim:

1. A conveyor means for transporting wafers, comprising:
    an elongated wafer carrying vehicle-transporting course;
    at least one wafer carrying vehicle movable along said transporting course, said vehicle having a generally C-shaped cross-section when viewed in side elevation, an upper arm having an upwardly open recess for receiving a wafer to be transported, a vertical arm from the upper end of which said upper arm extends, and a lower arm extending from the lower end of said vertical arm, said upper arm and said vertical arm having a transverse slot therethrough;
    permanent magnets on the under surface of said lower arm and magnetic fluid interposed between said lower magnets and said transporting course; and
    a moving means for moving the vehicle along the transporting course, whereby the vehicle is caused to float by the magnetic fluid above the transporting course and is caused to move along the transporting course so as to transport the wafers therealong.

* * * * *